(12) United States Patent
Kim et al.

(10) Patent No.: US 11,974,469 B2
(45) Date of Patent: Apr. 30, 2024

(54) DISPLAY DEVICE AND METHOD OF MANUFACTURING THE SAME

(71) Applicant: LG Display Co., Ltd., Seoul (KR)

(72) Inventors: Jae Hyun Kim, Gimpo-si (KR); Jin Chae Jeon, Paju-si (KR); Sun Young Choi, Seoul (KR); Mi Jin Jeong, Goyang-si (KR); Jeoung In Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 268 days.

(21) Appl. No.: 17/411,897

(22) Filed: Aug. 25, 2021

(65) Prior Publication Data

US 2022/0165821 A1 May 26, 2022

(30) Foreign Application Priority Data

Nov. 26, 2020 (KR) .................. 10-2020-0161715

(51) Int. Cl.
| | |
|---|---|
| *H01L 27/32* | (2006.01) |
| *H01L 27/12* | (2006.01) |
| *H01L 51/56* | (2006.01) |
| *H10K 59/124* | (2023.01) |
| *H10K 71/00* | (2023.01) |
| *H10K 59/12* | (2023.01) |

(52) U.S. Cl.
CPC ....... *H10K 59/124* (2023.02); *H01L 27/1225* (2013.01); *H01L 27/1248* (2013.01); *H10K 71/00* (2023.02); *H10K 59/1201* (2023.02)

(58) Field of Classification Search
CPC ............ H10K 59/124; H01L 21/02315; H01L 21/02321; H01L 21/02329; H01L 21/02332; H01L 21/0234; H01L 21/02362; H01L 21/2236; H01L 21/28202; H01L 21/76825; H01L 21/76826
See application file for complete search history.

(56) References Cited

U.S. PATENT DOCUMENTS

| | | | |
|---|---|---|---|
| 2005/0070054 A1* | 3/2005 | Hotta | ........... H01L 27/124 257/E27.111 |
| 2015/0021594 A1* | 1/2015 | Yamada | ........... H01L 27/14658 257/66 |

(Continued)

FOREIGN PATENT DOCUMENTS

| | | | | |
|---|---|---|---|---|
| KR | 10-2021-0086344 A | * | 7/2021 | ......... H01L 27/1214 |
| KR | 10-2021-0086344 A | | 7/2021 | |

OTHER PUBLICATIONS

Machine translation, Ji, Korean Pat. Pub. No. KR20210086344A, Espacenet, translation date: Jun. 9, 2023, all pages. (Year: 2023).*

*Primary Examiner* — Victoria K. Hall
(74) *Attorney, Agent, or Firm* — LG Display Co., Ltd.

(57) ABSTRACT

Disclosed is a display device and a method of manufacturing the same having improved reliability. In the display device, at least one of a plurality of dielectric films disposed between an oxide semiconductor layer and a light-emitting device includes a lower region disposed on the oxide semiconductor layer and an upper region disposed on the lower region, the upper region including a trap element configured to trap hydrogen, whereby reliability of a thin film transistor including the oxide semiconductor layer is improved.

16 Claims, 11 Drawing Sheets

(56) References Cited

U.S. PATENT DOCUMENTS

| | | | |
|---|---|---|---|
| 2015/0188063 A1* | 7/2015 | Takeya | H10K 10/482 |
| | | | 257/40 |
| 2016/0118502 A1* | 4/2016 | Yamazaki | H01L 29/7869 |
| | | | 257/43 |
| 2018/0158954 A1* | 6/2018 | Matsumoto | H01L 21/385 |
| 2022/0005901 A1* | 1/2022 | Tanaka | H01L 29/78618 |
| 2022/0140033 A1* | 5/2022 | Kim | H01L 29/792 |
| | | | 257/40 |

* cited by examiner

DISPLAY DEVICE AND METHOD OF MANUFACTURING THE SAME

CROSS-REFERENCE TO RELATED APPLICATIONS

This application claims the benefit of Republic of Korea Patent Application No. 10-2020-0161715, filed on Nov. 26, 2020, which is hereby incorporated by reference as if fully set forth herein.

BACKGROUND

Field

The present disclosure relates to a display device a method of manufacturing the same, and more particularly to a display device a method of manufacturing the same having improved reliability.

Discussion of the Related Art

In a display device, a thin film transistor (TFT) is used as a switching device and/or a driving device. Based on a material used as an active layer, the thin film transistor is classified as a thin film transistor using amorphous silicon, a thin film transistor using polysilicon, or a thin film transistor using an oxide semiconductor. Thereamong, the thin film transistor using the oxide semiconductor has higher mobility and less leakage current than the thin film transistor using the amorphous silicon.

However, an excessive amount of hydrogen introduced into an oxide semiconductor layer increases carrier concentration of a channel region. As a result, the electrical properties (e.g. threshold voltage) of the thin film transistor are changed, whereby reliability of the thin film transistor is deteriorated.

SUMMARY

Accordingly, the present disclosure is directed to a display device and a method of manufacturing the same that substantially obviate one or more problems due to limitations and disadvantages of the related art.

It is an object of the present invention to provide a display device having improved reliability.

Additional advantages, objects, and features of the invention will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a thin film transistor disposed on a substrate, the thin film transistor including an oxide semiconductor layer, a light-emitting device electrically connected to the thin film transistor, and a plurality of dielectric films disposed between the oxide semiconductor layer and the light-emitting device, wherein at least one of the plurality of dielectric films includes a lower region disposed on the oxide semiconductor layer and an upper region disposed on the lower region, the upper region including a trap element configured to trap hydrogen.

The trap element may be at least one of nitrogen, fluorine, and boron.

The lower region may have a lower content of the trap element than the upper region.

The content of the trap element in the lower region may be 0%.

The trap element may be formed such that the content of the trap element gradually decreases from the upper part of the upper region to the lower upper region.

The lower region may be formed of SiOx.

The thin film transistor may include a gate electrode disposed on the oxide semiconductor layer, a source electrode configured to contact the oxide semiconductor layer, and a drain electrode opposite the source electrode, the drain electrode being configured to contact the oxide semiconductor layer, and the plurality of dielectric films may include an interlayer dielectric film, disposed between each of the source and drain electrodes and the gate electrode, and a gate dielectric film disposed between the oxide semiconductor layer and the gate electrode.

At least one of the interlayer dielectric film and the gate dielectric film may include a lower interlayer region, which is the lower region, and an upper interlayer region, which is the upper region.

The gate electrode may include an upper gate region including the trap element and a lower gate region disposed between the oxide semiconductor layer and the upper gate region.

The trap element included in the upper interlayer region of the gate dielectric film may be disposed in the remaining region excluding the region configured to overlap the gate electrode.

The trap element included in the upper interlayer region of the gate dielectric film may be disposed in the remaining region excluding the region configured to overlap a channel region of the oxide semiconductor layer.

The display device may further include first and second upper buffer layers and a storage capacitor disposed under the oxide semiconductor layer. At least one portion of at least one of the first and second upper buffer layers and a lower storage capacitor electrode of the storage capacitor may include the trap element.

An upper storage capacitor electrode of the storage capacitor may be electrically connected to a drain electrode of the thin film transistor.

The display device may further include an encapsulation unit disposed on the light-emitting device. The encapsulation unit may include a plurality of inorganic encapsulation layers and an organic encapsulation layer disposed between the plurality of inorganic encapsulation layers.

A method of manufacturing a display device may include forming an oxide semiconductor layer of a thin film transistor on a substrate, forming a gate dielectric film on the oxide semiconductor layer, and forming a gate electrode of the thin film transistor on the gate dielectric film, primarily plasma-treating the surface of each of the gate electrode and the gate dielectric film using a source gas including a trap element, such that at least one of the gate electrode and the gate dielectric film includes an upper region including the trap element and a lower region including no trap element; forming an interlayer dielectric film on the gate electrode and the gate dielectric film, secondarily plasma-treating the surface of the interlayer dielectric film using gas including the trap element, such that the interlayer dielectric film includes an upper region including the trap element and a lower interlayer region including no trap element, and sequentially forming source and drain electrodes of the thin film transistor, a pixel connection electrode, a light-emitting device, and an encapsulation unit on the substrate.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

DETAILED DESCRIPTION

Hereinafter, embodiments of the present disclosure will be described in detail with reference to the accompanying drawings.

Figure 1:
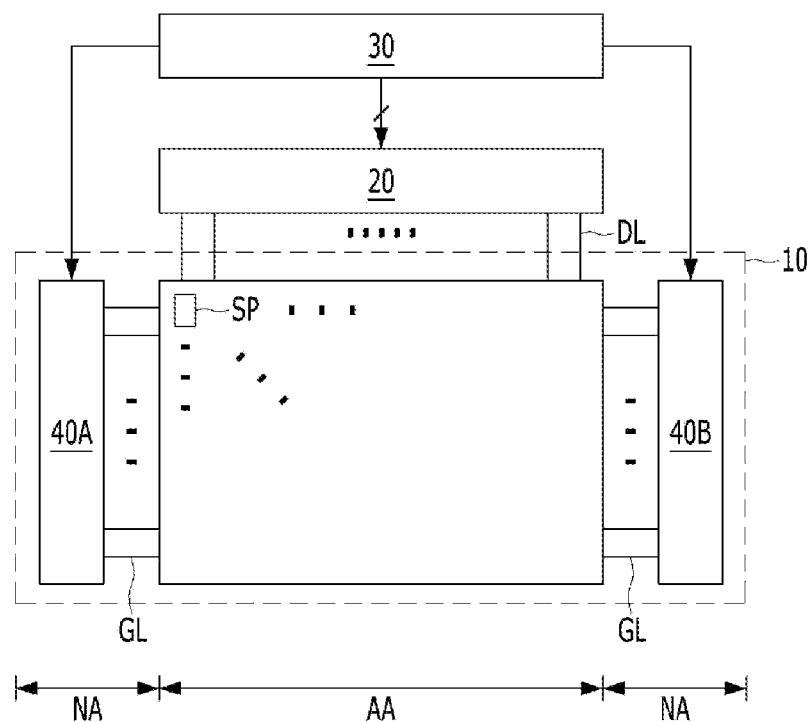
FIG. 1 is a block diagram of a display device according to an embodiment of the present disclosure.

FIG. 1 is a block diagram of an organic light-emitting display device according to an embodiment of the present disclosure.

The organic light-emitting display device shown in FIG. 1 includes an organic light-emitting display panel 10 and a panel driving unit configured to drive the display panel 10. The panel driving unit includes a data driving unit 20, gate driving units 40A and 40B, and a timing controller 30.

The timing controller 30 generates data control signals and gate control signals for controlling driving timing of the data driving unit 20 and the gate driving units 40A and 40B and supplies the same to the data driving unit 20 and the gate driving units 40A and 40B. The timing controller 30 image-processes image data and supplies the same to the data driving unit 20.

The data driving unit 20 is controlled by the data control signal supplied from the timing controller 30, and converts the image data supplied from the timing controller 30 into an analog data signal and supplies the same to data lines DL of the display panel 10.

Each of the gate driving units 40A and 40B is realized by a gate in panel (GIP) circuit directly formed in a non-active area NA on the display panel 10 in the form of a thin film transistor. The gate driving units 40A and 40B are disposed in the non-active area NA of at least one of the left and right sides of the display panel 10.

Each of the gate driving units 40A and 40B outputs a gate signal while shifting the level of gate voltage in response to the gate control signal supplied from the timing controller 30. Each of the gate driving units 40A and 40B outputs a gate signal through gate lines GL.

The display panel 10 includes an active area AA configured to realize a screen on which an input image is displayed and a non-active area NA disposed on at least one side of the active area AA.

The non-active area NA is an area in which no input image is displayed. No subpixels SP are disposed in the non-active area NA, and signal lines and the gate driving units 40A and 40B are disposed in the non-active area NA.

Figure 2:
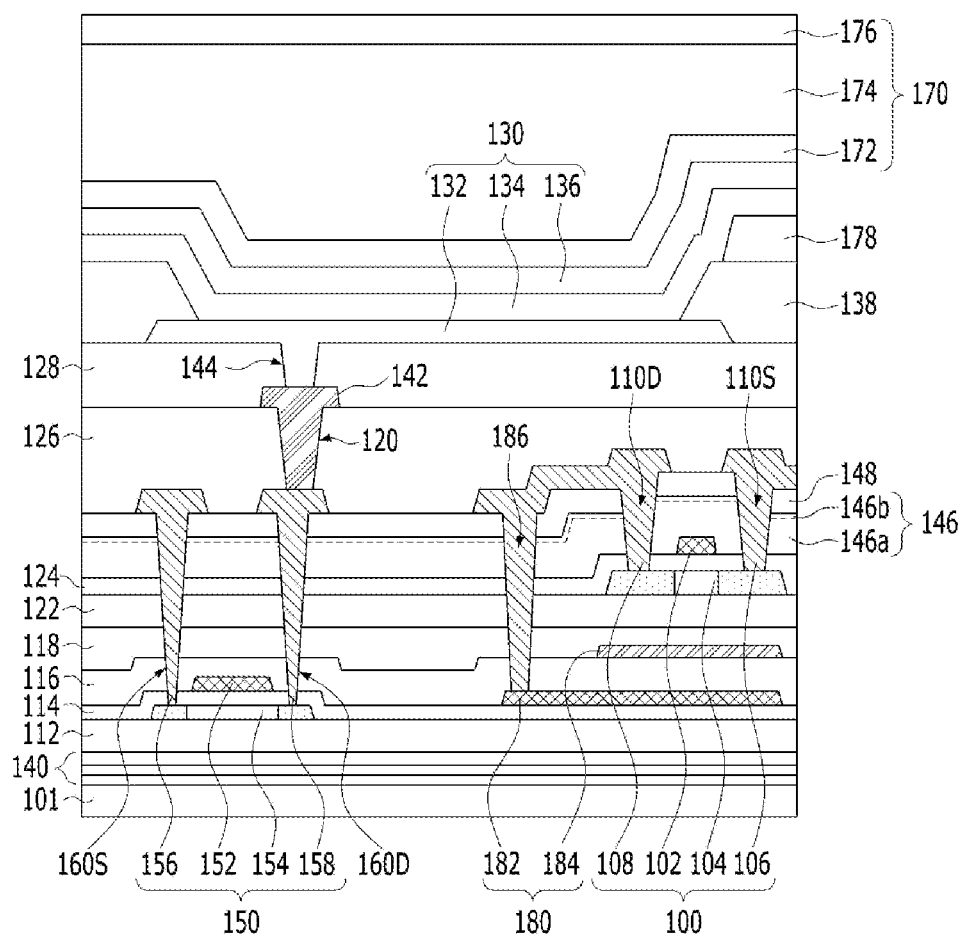
FIG. 2 is a sectional view of the display device shown in FIG. 1 according to an embodiment of the present disclosure.

In the active area AA, subpixels SP connected to the data lines DL and the gate lines GL, which intersect each other, are disposed in a matrix form. As shown in FIG. 2, each of the subpixels SP includes a light-emitting device 130 and at least one driving transistor 150 and at least one switching transistor 100 electrically connected to the light-emitting device 130. Here, one of the switching transistor 100 and the driving transistor 150 includes one of an oxide semiconductor layer and a polycrystalline semiconductor layer, and the other of the switching transistor 100 and the driving transistor 150 includes the other of the oxide semiconductor layer and the polycrystalline semiconductor layer. Hereinafter, a structure in which the switching transistor 100 includes an oxide semiconductor layer and the driving transistor 150 includes a polycrystalline semiconductor layer will be described by way of example.

The switching transistor 100 switches data voltage that is written in each subpixel SP located in the active area AA. As shown in FIG. 2, the switching transistor 100 includes an oxide semiconductor layer 104, a first gate electrode 102, a first source electrode 106, and a first drain electrode 108.

The first gate electrode 102 is formed on a second gate dielectric film 124 so as to overlap the oxide semiconductor layer 104 via the second gate dielectric film 124. The first gate electrode 102 is electrically connected to the gate line GL.

The oxide semiconductor layer 104 is formed on a second upper buffer layer 122 so as to overlap the first gate electrode 102 in order to form a channel between the first source electrode 106 and the first drain electrode 108. The oxide semiconductor layer 104 is formed of an oxide including at least one metal selected from among Zn, Cd, Ga, In, Sn, Hf, and Zr. The switching transistor 100 including the oxide semiconductor layer 104 has higher charge mobility and less leakage current than a driving transistor 150 including a polycrystalline semiconductor layer 154. Consequently, it is preferable for the switching transistor including the oxide semiconductor layer 104 to be applied to a switching and sensing thin film transistor, on time of which is short and off time of which is long.

Each of the second gate dielectric film 124 and the second upper buffer layer 122, which are adjacent to the upper part and the lower part of the oxide semiconductor layer 104, respectively, is formed of an inorganic film having a smaller amount of hydrogen particles than a first upper buffer layer 118 and a third interlayer dielectric film 148. For example, each of the second gate dielectric film 124 and the second upper buffer layer 122 is formed of silicon oxide (SiOx), and each of the first upper buffer layer 118 and the third interlayer dielectric film 148 is formed of silicon nitride (SiNx). Consequently, it is possible to prevent hydrogen in the first upper buffer layer 118 and the third interlayer dielectric film 148 and hydrogen in the polycrystalline semiconductor layer 154 from being spread to the oxide semiconductor layer 104 when the oxide semiconductor layer 104 is thermally treated.

Each of the first source electrode 106 and the first drain electrode 108 may be formed on the third interlayer dielectric film 148 so as to have a single-layered or multilayered structure formed of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first source electrode 106 is connected to a source region of the oxide semiconductor layer 104 through a first source contact hole 110S formed through the second gate dielectric film 124, a second interlayer dielectric film 146, and the third interlayer dielectric film 148. In addition, the first source electrode 106 is electrically connected to the data line DL.

The first drain electrode 108 is connected to a drain region of the oxide semiconductor layer 104 through a first drain contact hole 110D formed through the second gate dielectric film 124, the second interlayer dielectric film 146, and the third interlayer dielectric film 148.

The first source electrode 106 and the first drain electrode 108 are formed so as to be opposite each other via a channel region of the oxide semiconductor layer 104.

The driving transistor 150 is operated such that driving current flows between a high-voltage supply line and a low-voltage supply line depending on data voltage stored in a storage capacitor 180. As shown in FIG. 2, the driving transistor 150 includes a second gate electrode 152 electrically connected to the first drain electrode 108 of the switching transistor 100, a second source electrode 156 connected to the high-voltage supply line, a second drain electrode 158 connected to the light-emitting device 130, and a polycrystalline semiconductor layer 154 configured to form a channel between the second source electrode 156 and the second drain electrode 158.

The polycrystalline semiconductor layer 154 is formed on a lower buffer layer 112 so as to overlap the second gate electrode 152 in order to form a channel between the second source electrode 156 and the second drain electrode 158. The polycrystalline semiconductor layer 154 has high mobility, whereby power consumption of the polycrystalline semiconductor layer 154 is low and reliability of the polycrystalline semiconductor layer 154 is high. Consequently, it is preferable that the polycrystalline semiconductor layer 154 be applied to the driving transistor 150 of each pixel, each of the gate driving units 40A and 40B, which drive the gate lines GL, and/or a multiplexer (MUX). A multi-buffer layer 140 and the lower buffer layer 112 are disposed between the polycrystalline semiconductor layer 154 and a substrate 101. The multi-buffer layer 140 retards spread of moisture and/or oxygen that has permeated the substrate 101. The multi-buffer layer 140 is formed as the result of silicon nitride (SiNx) and silicon oxide (SiOx) being alternately stacked at least once. The lower buffer layer 112 blocks various kinds of defects introduced from the substrate 101, whereby it is possible to prevent damage to the polycrystalline semiconductor layer 154. The lower buffer layer 112 may be formed of a-Si, silicon nitride (SiNx), or silicon oxide (SiOx).

The second gate electrode 152 is formed on a first gate dielectric film 114 so as to overlap a channel region of the polycrystalline semiconductor layer 154 via the first gate dielectric film 114. The second gate electrode 152 may have a single-layered or multilayered structure formed of the same material as a lower storage capacitor electrode 182, such as one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The second source electrode 156 is connected to a source region of the polycrystalline semiconductor layer 154 through a second source contact hole 160S formed through the first gate dielectric film 114, a first interlayer dielectric film 116, the first upper buffer layer 118, the second upper buffer layer 122, the second gate dielectric film 124, the second interlayer dielectric film 146, and the third interlayer dielectric film 148.

The second drain electrode 158 is connected to a drain region of the polycrystalline semiconductor layer 154 through a second drain contact hole 160D formed through the first gate dielectric film 114, the first interlayer dielectric film 116, the first upper buffer layer 118, the second upper buffer layer 122, the second gate dielectric film 124, the second interlayer dielectric film 146, and the third interlayer dielectric film 148. The second source electrode 156 and the second drain electrode 158 are formed so as to be opposite each other via the channel region of the polycrystalline semiconductor layer 154.

The storage capacitor 180 is formed as the result of the lower storage capacitor electrode 182 and a upper storage capacitor electrode 184 overlapping each other via the first interlayer dielectric film 116.

The lower storage capacitor electrode 182 is formed on the first gate dielectric film 114 and is formed of the same material as the second gate electrode 152 on the same layer as the second gate electrode 152. The lower storage capacitor electrode 182 is exposed through a storage contact hole 186 formed through the first interlayer dielectric film 116, the first upper buffer layer 118, the second upper buffer layer 122, the second gate dielectric film 124, the second interlayer dielectric film 146, and the third interlayer dielectric film 148 so as to be electrically connected to the first drain electrode 108 of the switching transistor 100.

The upper storage capacitor electrode 184 is disposed on the first interlayer dielectric film 116. The upper storage capacitor electrode 184 is electrically connected to the second drain electrode 158 of the driving transistor 150.

The first interlayer dielectric film 116, which is disposed between the lower storage capacitor electrode 182 and the upper storage capacitor electrode 184, is formed of an inorganic dielectric material, such as SiOx or SiNx. It is preferable that the first interlayer dielectric film 116 be formed of SiNx, which has higher permittivity than SiOx. Consequently, the lower storage capacitor electrode 182 and the upper storage capacitor electrode 184 overlap each other via the first interlayer dielectric film 116 formed of SiNx, which has high permittivity, whereby the capacitance of the storage capacitor, which is proportional to permittivity, is increased.

The light-emitting device 130 includes an anode 132, a cathode 136, and a light-emitting stack 134 formed between the anode 132 and the cathode 136.

The anode 132 is disposed on a second planarization layer 128 so as to be independent for each subpixel. The anode 132 is connected to a pixel connection electrode 142 exposed through a second pixel contact hole 144 formed through the second planarization layer 128. Here, the pixel connection electrode 142 is connected to the second drain electrode 158 exposed through a first pixel contact hole 120 formed through a first planarization layer 126.

The anode 132 is disposed on the second planarization layer 128 so as to overlap at least one of the driving and switching transistors 150 and 100 as well as a light-emitting region provided by a bank 138, whereby light emission area is increased.

The bank 138 is formed so as to expose the anode 132, whereby the light-emitting region is provided. The bank 138 is formed in a non-emissive area of the active area AA while being formed of an opaque material (e.g. black) so as to prevent light interference between adjacent subpixels, or is formed in the non-active area NA as well as the non-emissive area of the active area AA so as to overlap the gate driving units 40A and 40B. In this case, the bank 138 includes a shading material constituted by at least one of color pigment, organic black, and carbon.

The light-emitting stack 134 is formed as the result of a hole-related layer, an organic emissive layer, and an electron-related layer being stacked on the anode 132 in that order or in the reverse order. The light-emitting stack 134 is formed through a manufacturing process using a fine metal mask (FMM). At this time, in order to prevent damage to the light-emitting stack 134 and/or the bank 138 due to the fine metal mask (FMM), a spacer 178 is disposed on the bank 138. The spacer 178 is formed of an organic dielectric material, in the same manner as the bank 138 and the first and second planarization layers 126 and 128.

The cathode 136 is formed on the upper surface and the side surface of the light-emitting stack 134 so as to be opposite the anode 132 via the light-emitting stack 134. The cathode 136 is formed so as to be shared by all of the subpixels disposed in the active area AA. An encapsulation unit 170 is disposed on the substrate 101 having the cathode 136 formed thereon.

The encapsulation unit 170 prevents external moisture or oxygen from permeating the light-emitting device 130, which has low resistance to external moisture or oxygen. To this end, the encapsulation unit 170 includes a plurality of inorganic encapsulation layers 172 and 176 and an organic encapsulation layer 174 disposed between the plurality of inorganic encapsulation layers 172 and 176. The inorganic encapsulation layer 176 is disposed as the uppermost layer. At this time, the encapsulation unit 170 includes at least two inorganic encapsulation layers 172 and 176 and at least one organic encapsulation layer 174. Hereinafter, an encapsulation unit 170 having a structure in which an organic encapsulation layer 174 is disposed between first and second inorganic encapsulation layers 172 and 176 will be described by way of example.

The organic encapsulation layer 174 is disposed between the inorganic encapsulation layers 172 and 176 to reduce stress between respective layers due to bending of a substrate 101 of a bendable display device. That is, the organic encapsulation layer 174 serves as a shock absorber. In addition, the organic encapsulation layer 174 strengthens planarization performance. The organic encapsulation layer 174 is formed of an organic dielectric material, such as an acrylic resin, an epoxy resin, polyimide, polyethylene, or silicon oxycarbide (SiOC).

The first inorganic encapsulation layer 172 is formed on the substrate 101 having the cathode 136 formed thereon so as to be closest to the light-emitting device 130. The first inorganic encapsulation layer 172 is formed of an inorganic dielectric material capable of being deposited at low temperature, such as silicon nitride (SiNx), silicon oxide (SiOx), silicon oxynitride (SiON), or aluminum oxide (Al$_2$O$_3$). Consequently, the first inorganic encapsulation layer 172 is deposited in a low-temperature atmosphere, whereby it is possible to prevent damage to the light-emitting stack 134, which has low resistance to a high-temperature atmosphere, in a process of depositing the first inorganic encapsulation layer 172.

The second inorganic encapsulation layer 176 is formed on the substrate 101 having the organic encapsulation layer 174 formed thereon so as to cover the upper surface and the side surface of each of the organic encapsulation layer 174 and the first inorganic encapsulation layer 172. Consequently, the second inorganic encapsulation layer 176 reduces or minimizes or prevents external moisture or oxygen from permeating the first inorganic encapsulation layer 172 and the organic encapsulation layer 174. The second inorganic encapsulation layer 176 is formed of an inorganic dielectric material, such as silicon nitride (SiNx), silicon oxide (SiOx), silicon oxynitride (SiON), or aluminum oxide (Al$_2$O$_3$).

Figure 3:
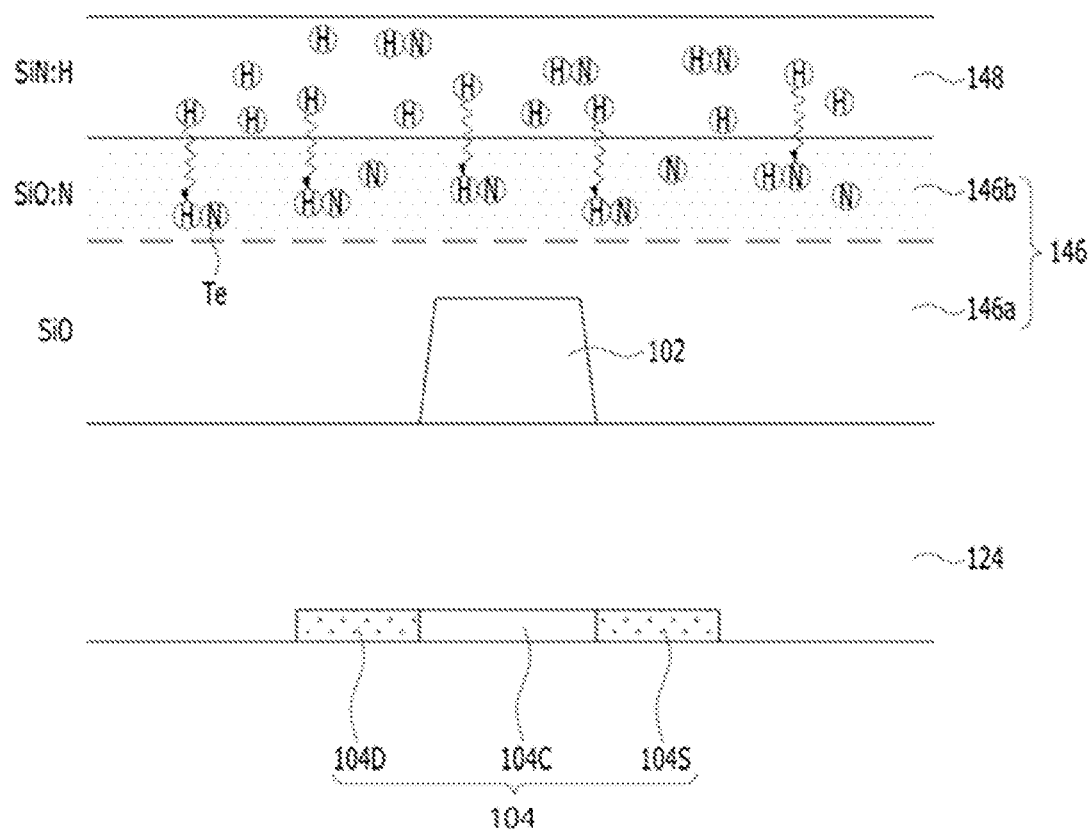
FIG. 3 is a view illustrating a process in which hydrogen moves from an inorganic encapsulation layer shown in FIG. 2 according to an embodiment of the present disclosure.

In order to prevent the channel region 104C of the oxide semiconductor layer 104 from becoming conductive due to hydrogen (H) spread from the first and second inorganic encapsulation layers 172 and 176 to the substrate 101, the second interlayer dielectric film 146 is formed so as to include a trap element Te, as shown in FIG. 3.

As shown in FIGS. 2 and 3, the second interlayer dielectric film 146, which is adjacent to the oxide semiconductor layer 104, includes a lower interlayer region 146a and an upper interlayer region 146b sequentially disposed on the second gate dielectric film 124.

The lower interlayer region 146a is disposed on the second gate dielectric film 124. The lower interlayer region 146a is formed of SiOx such that the content of a trap element Te capable of trapping hydrogen atoms (H) is 0%, or is formed of SiOx having a lower content of a trap element Te than the upper interlayer region 146b.

The upper interlayer region 146b is formed on the lower interlayer region 146a so as to include a trap element Te capable of trapping hydrogen atoms (H). The trap element Te is constituted by at least one of nitrogen (N), fluorine (F), and boron (B). The trap element Te is formed in the upper interlayer region 146b so as to have a predetermined content, or is formed such that the content of the trap element Te gradually decreases from the upper part of the upper interlayer region 146b to the lower interlayer region 146a.

The second interlayer dielectric film 146 including the lower interlayer region 146a and the upper interlayer region 146b is formed by entirely depositing SiOx on the substrate 101 having the source and drain regions 104S and 104D of the oxide semiconductor layer 104 formed thereon through a doping process and injecting the trap element Te into at least a portion of SiOx through a surface plasma treatment process or a doping process. Consequently, the second interlayer dielectric film 146 is partitioned into the upper interlayer region 146b including the trap element Te and the lower interlayer region 146a including no trap element Te.

At this time, the trap element Te injected into the second interlayer dielectric film 146 through the plasma treatment process traps unbonded hydrogen (H+), i.e. dissociated hydrogen (H+), whereby it is possible to inhibit introduction of hydrogen (H) into the oxide semiconductor layer 104. Particularly, in the case in which the trap element Te is nitrogen (N), hydrogen (H)—nitrogen (N) bond dissociation energy is lower than hydrogen (H)—oxygen (O) bond dissociation energy. Consequently, dissociated hydrogen (H+) is irreversibly bonded with nitrogen (N) in the upper interlayer region 146b, rather than oxygen (O) in the oxide semiconductor layer 104, and is trapped in the upper interlayer region 146b.

In the present disclosure, as described above, hydrogen (H) spread from the encapsulation unit 170 is trapped by nitrogen (N) included in the third interlayer dielectric film 148 formed of SiNx and the trap element Te included in the second interlayer dielectric film 146. Consequently, it is possible to prevent hydrogen (H) spread from the encapsulation unit 170 from being introduced into the oxide semiconductor layer 104, whereby it is possible to prevent fluctuation in threshold voltage of the switching transistor 100 including the oxide semiconductor layer 104.

Figure 4:
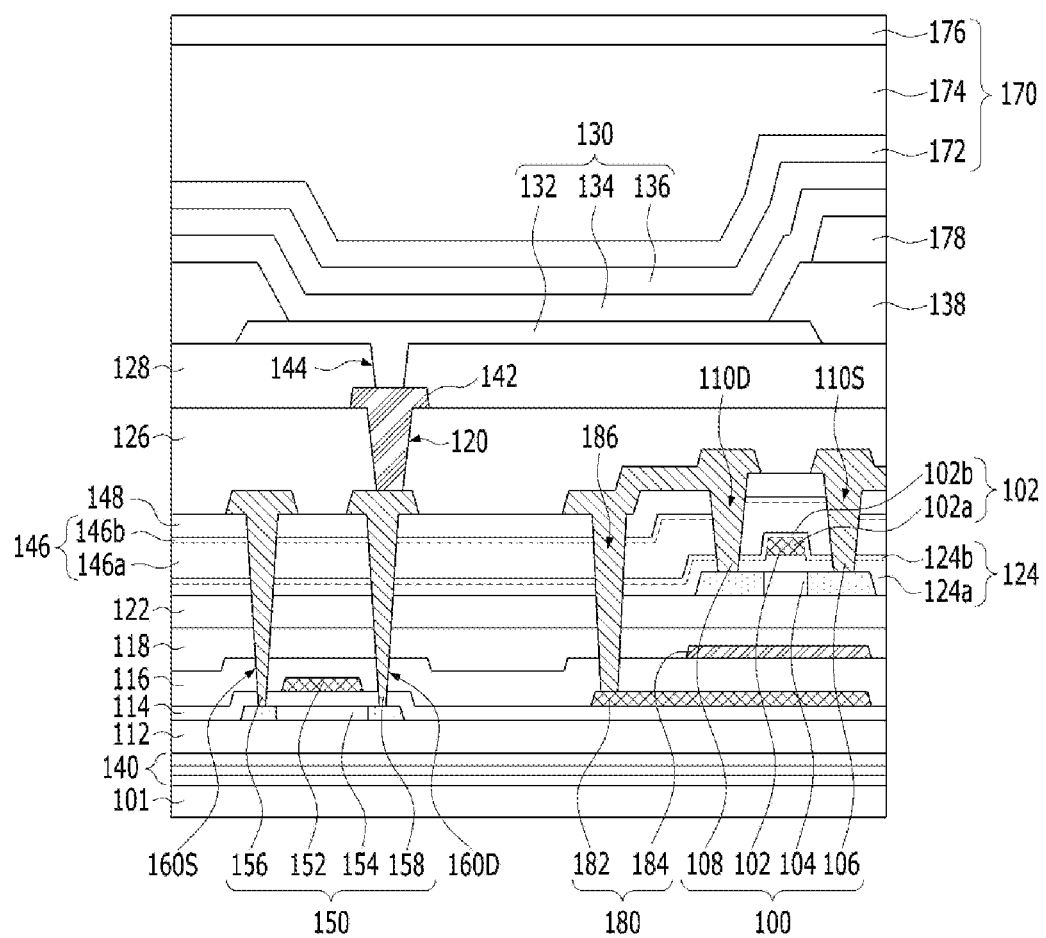
FIG. 4 is a sectional view of another embodiment of the display device shown in FIG. 1 according to an embodiment of the present disclosure.

FIG. 4 is a sectional view of an organic light-emitting display device according to a second embodiment of the present disclosure.

The organic light-emitting display device shown in FIG. 4 is identical in construction to the organic light-emitting display device shown in FIG. 2 except that not only a second interlayer dielectric film 146 but also a second gate dielectric film 124 and a first gate electrode 102 include a trap element. Consequently, a detailed description of the same components will be omitted.

Figure 5:
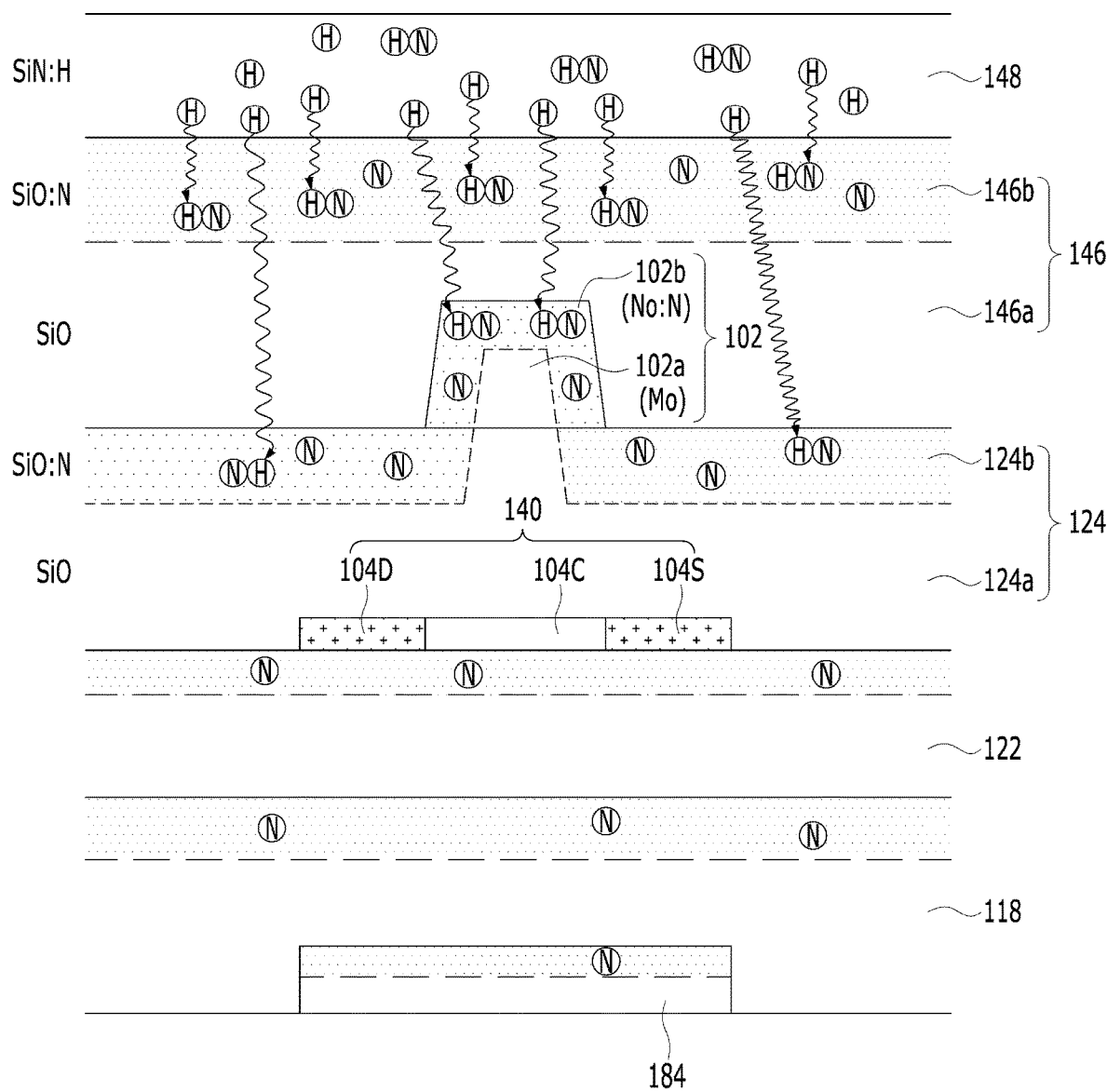
FIG. 5 is a view illustrating a process in which hydrogen moves from an inorganic encapsulation layer shown in FIG. 4.

As shown in FIGS. 4 and 5, the second gate dielectric film 124 includes a lower dielectric region 124a and an upper dielectric region 124b sequentially disposed on a second upper buffer layer 122.

The lower dielectric region 124a is disposed on the second upper buffer layer 122. The lower dielectric region 124a is formed of SiOx such that no trap element Te capable of trapping hydrogen atoms (H) is included, or is formed of SiOx having a lower content of a trap element Te than the upper dielectric region 124b.

The upper dielectric region 124b is formed on the lower dielectric region 124a so as to include a trap element Te capable of trapping hydrogen atoms (H). The trap element Te is constituted by at least one of nitrogen (N), fluorine (F), and boron (B). The trap element Te is formed in the upper dielectric region 124b so as to have a predetermined content, or is formed such that the content of the trap element Te gradually decreases from the upper part of the upper dielectric region 124b to the lower dielectric region 124a.

The trap element Te is injected into the second gate dielectric film 124 through a plasma treatment process after the first gate electrode 102 is formed. In this case, the upper dielectric region 124b is formed so as to include the trap element Te in the remaining region excluding the region thereof overlapping a lower gate region 102a of the first gate electrode 102. Consequently, it is possible to simultaneously inject the trap element into the second gate dielectric film 124 including the upper dielectric region 124b and the first gate electrode 102, whereby it is possible to simplify the process.

The first gate electrode 102 includes lower and upper gate regions 102a and 102b disposed on the second gate dielectric film 124.

The lower gate region 102a is formed of a gate metal layer (e.g. Mo) such that no trap element Te is included on the second gate dielectric film 124, or is formed of a gate metal layer having a lower content of a trap element Te than the upper gate region 102b.

The upper gate region 102b is formed on the upper surface and the side surface of the lower gate region 102a so as to include a trap element Te capable of trapping hydrogen atoms (H). The trap element Te is constituted by at least one of nitrogen (N), fluorine (F), and boron (B). The trap element Te is formed in the upper gate region 102b so as to have a predetermined content, or is formed such that the content of the trap element Te gradually decreases from the upper part of the upper gate region 102b to the lower gate region 102a.

Figure 6:
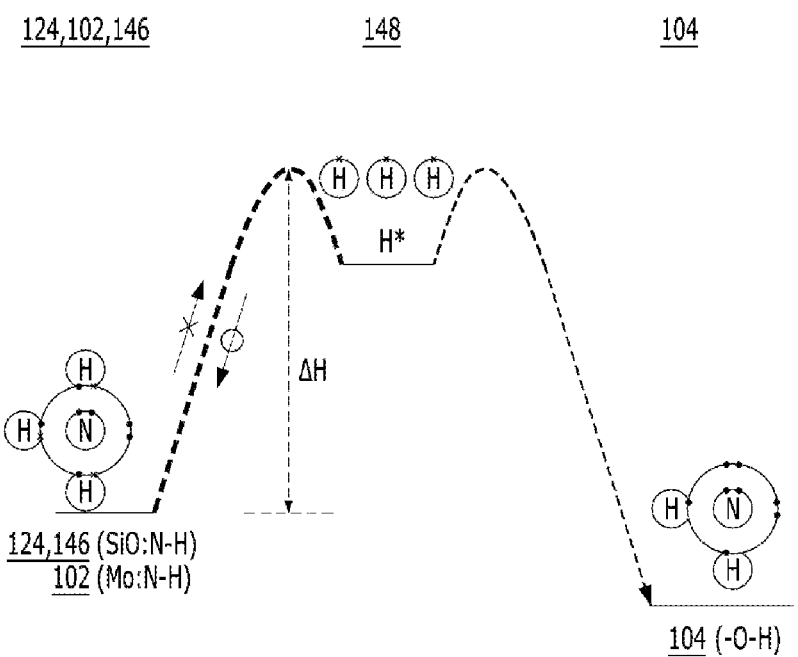
FIG. 6 is a view illustrating a process in which a trap element shown in FIG. 4 and hydrogen are bonded with each other.

The trap element Te included in at least one of the upper gate region 102b, the upper dielectric region 124b, and an upper interlayer region 146b traps unbonded hydrogen (H+), i.e. dissociated hydrogen (H+), whereby it is possible to inhibit introduction of hydrogen (H) into an oxide semiconductor layer 104. Particularly, in the case in which the trap element Te is nitrogen (N), hydrogen (H)—nitrogen (N) bond dissociation energy is lower than hydrogen (H)—oxygen (0) bond dissociation energy, as shown in FIG. 6. Consequently, dissociated hydrogen (H+) is irreversibly bonded with nitrogen (N) in each of the upper gate region 102b, the upper dielectric region 124b, and the upper interlayer region 146b, rather than oxygen (O) in the oxide semiconductor layer 104, and is trapped in each of the upper gate region 102b, the upper dielectric region 124b, and the upper interlayer region 146b.

In the present disclosure, as described above, hydrogen spread from an encapsulation unit 170 is trapped in the upper gate region 102b, the upper dielectric region 124b, and the upper interlayer region 146b by the trap element Te (e.g. nitrogen (N)) included in the upper gate region 102b, the upper dielectric region 124b, and the upper interlayer region 146b. In this case, it is possible to prevent hydrogen spread from the encapsulation unit 170 from being introduced into the oxide semiconductor layer 104. In the present invention, therefore, it is possible to prevent a channel region 104C of the oxide semiconductor layer 104 from becoming conductive due to hydrogen spread from the encapsulation unit 170, whereby it is possible to prevent fluctuation in threshold voltage of a switching transistor 100.

FIGS. 7A to 7G are sectional views illustrating a method of manufacturing the organic light-emitting display device shown in FIG. 4 according to an embodiment of the present disclosure.

Figure 7A:
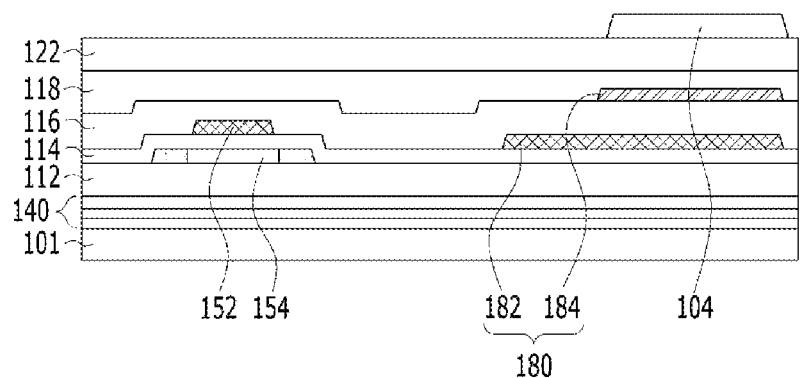
FIGS. 7A to 7G are sectional views illustrating a method of manufacturing the display device shown in FIG. 4 according to an embodiment of the present disclosure.

Referring to FIG. 7A, an oxide semiconductor layer 104 is formed on a substrate 101 having a polycrystalline semiconductor layer 154 and a second gate electrode 152 of a driving transistor and a storage capacitor 180 formed thereon.

Specifically, an inorganic dielectric material, such as SiOx or SiNx, is entirely deposited on the substrate 101 having the polycrystalline semiconductor layer 154 and the second gate electrode 152 of the driving transistor and the storage capacitor 180 formed thereon, whereby first and second upper buffer layers 118 and 122 are sequentially formed. Subsequently, an oxide including at least one metal selected from among Zn, Cd, Ga, In, Sn, Hf, and Zr is entirely deposited and patterned on the second upper buffer layer 122, whereby an oxide semiconductor layer 104 is formed.

Figure 7B:
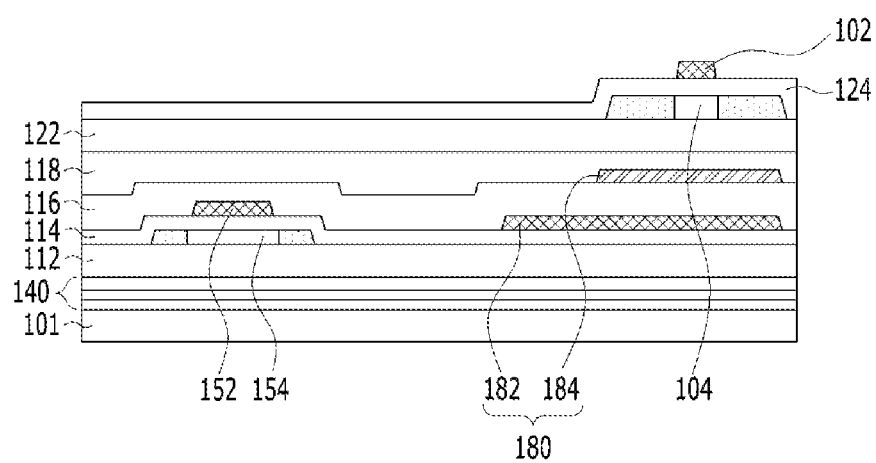

Referring to FIG. 7B, a second gate dielectric film 124 is formed on the substrate 101 having the oxide semiconductor layer 104 formed thereon, and a first gate electrode 102 is formed on the second gate dielectric film 124.

Specifically, SiOx is entirely deposited on the substrate 101 having the oxide semiconductor layer 104 formed thereon, whereby a second gate dielectric film 124 is formed. Subsequently, a gate metal layer is entirely deposited and patterned on the second gate dielectric film 124, whereby a first gate electrode 102 having a single-layered structure is formed. The oxide semiconductor layer 104 is doped with a dopant through a doping process using the first gate electrode 102 as a mask. As a result, source and drain regions 104S and 104D configured not to overlap the first gate electrode 102 and a channel region 104C configured to overlap the first gate electrode 102 are formed.

Figure 7C:
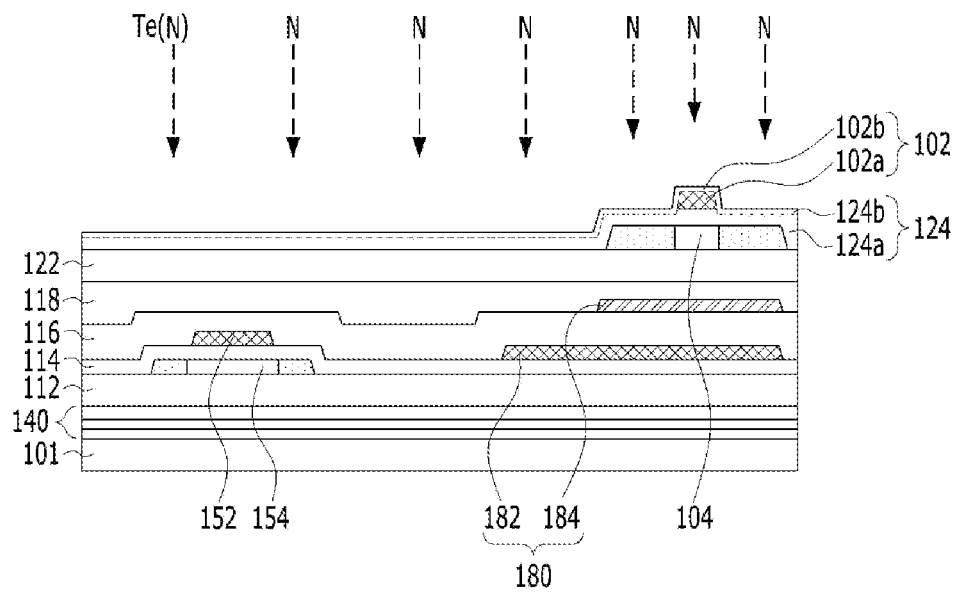

Referring to FIG. 7C, each of the second gate dielectric film 124 and the first gate electrode 102 formed on the substrate 101 is formed so as to have a multilayered structure.

Specifically, after the doping process using the first gate electrode 102 as the mask, the surface of each of the first gate electrode 102 and the second gate dielectric film 124 is primarily plasma-treated using a source gas (e.g. $NH_3$) including a trap element Te (e.g. nitrogen (N)). As a result, the first gate electrode 102 is formed so as to have a multilayered structure including an upper gate region 102b including a trap element and a lower gate region 102a including no trap element. In addition, the second gate dielectric film 124 is formed so as to have a multilayered structure including an upper dielectric region 124b including a trap element and a lower dielectric region 124a including no trap element.

Figure 7D:
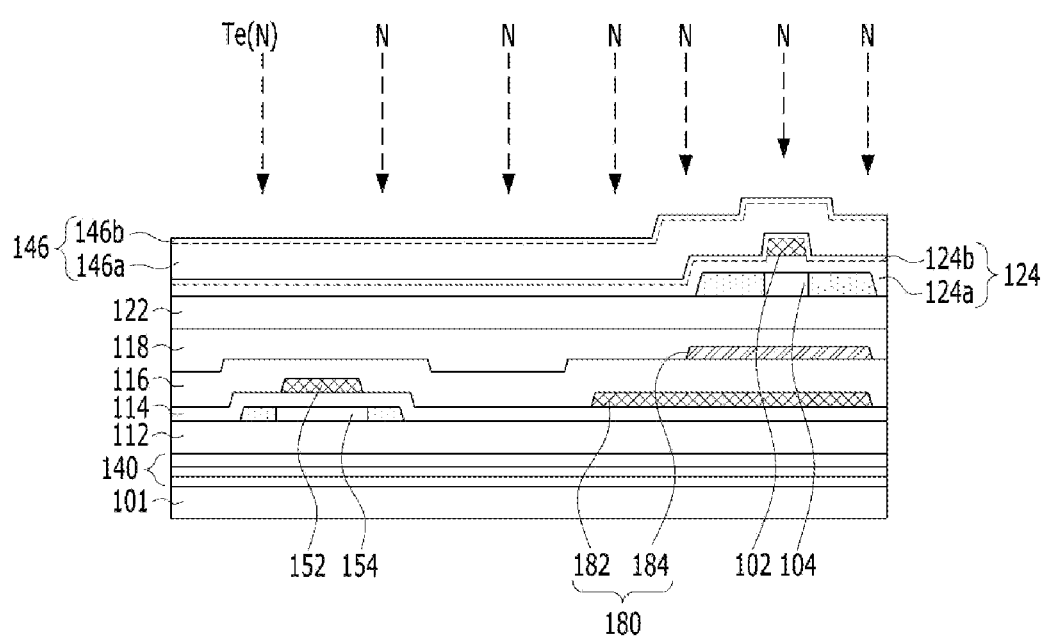

Referring to FIG. 7D, a second interlayer dielectric film 146 having a multilayered structure is formed on the substrate 101 having the multilayered second gate dielectric film 124 and the multilayered first gate electrode 102 formed thereon.

Specifically, SiOx is entirely deposited on the substrate 101 having the multilayered second gate dielectric film 124 and the multilayered first gate electrode 102 formed thereon, whereby a second interlayer dielectric film 146 is formed. Subsequently, the surface of the second interlayer dielectric film 146 is secondarily plasma-treated using gas (e.g. $NH_3$) including a trap element Te (e.g. nitrogen (N)). As a result, the second interlayer dielectric film 146 is formed so as to have a multilayered structure including an upper interlayer region 146b including a trap element and a lower interlayer region 146a including no trap element.

Figure 7E:
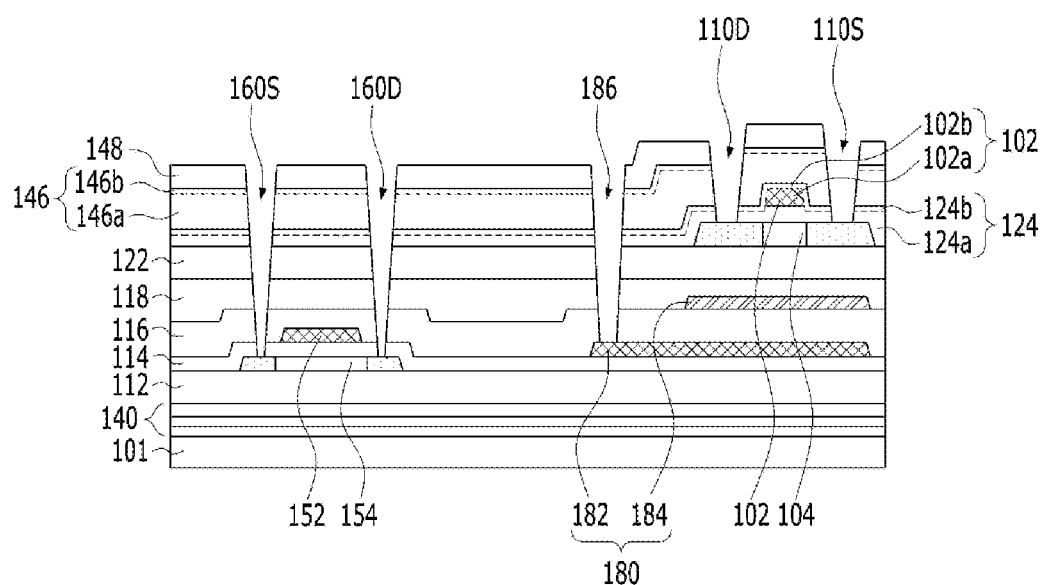

Referring to FIG. 7E, source contact holes 110S and 160S, drain contact holes 110D and 160D, and a storage contact hole 186 are formed on the substrate 101 having the second interlayer dielectric film 146 formed thereon.

Specifically, SiOx is entirely deposited on the substrate 101 having the second interlayer dielectric film 146 formed thereon, whereby a third interlayer dielectric film 148 is formed. Subsequently, a first gate dielectric film 114, a first interlayer dielectric film 116, the first upper buffer layer 118, the second upper buffer layer 122, the second gate dielectric film 124, the second interlayer dielectric film 146, and the third interlayer dielectric film 148 are selectively patterned, whereby source contact holes 110S and 160S, drain contact holes 110D and 160D, and a storage contact hole 186 are formed. Here, the first source contact hole 110S and the first drain contact hole 110D are formed through the second gate dielectric film 124, the second interlayer dielectric film 146, and the third interlayer dielectric film 148 to expose the oxide semiconductor layer 104. The second source contact hole 160S and the second drain contact hole 160D are formed through the first gate dielectric film 114, the first interlayer dielectric film 116, the first upper buffer layer 118, the second upper buffer layer 122, the second gate dielectric film 124, the second interlayer dielectric film 146, and the third interlayer dielectric film 148 to expose the polycrystalline semiconductor layer 154. The storage contact hole 186 is formed through the first interlayer dielectric film 116, the first upper buffer layer 118, the second upper buffer layer 122, the second gate dielectric film 124, the second interlayer dielectric film 146, and the third interlayer dielectric film 148 to expose a lower storage capacitor electrode 182.

Figure 7F:
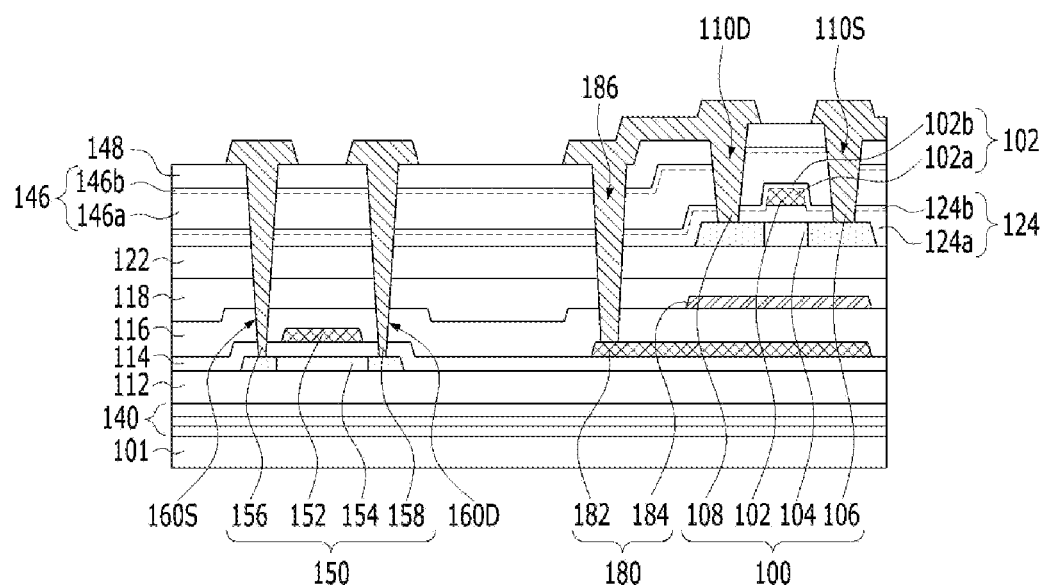

Referring to FIG. 7F, source and drain electrodes 106, 108, 156, and 158 are formed on the substrate 101 having the source contact holes 110S and 160S, the drain contact holes 110D and 160D, and the storage contact hole 186 formed thereon.

A source/drain metal layer is entirely deposited on the substrate 101 having the source contact holes 110S and 160S, the drain contact holes 110D and 160D, and the storage contact hole 186 formed thereon. Subsequently, the source/drain metal layer is patterned, whereby first and second source electrodes 106 and 156 and first and second drain electrodes 108 and 158 are formed.

Figure 7G:
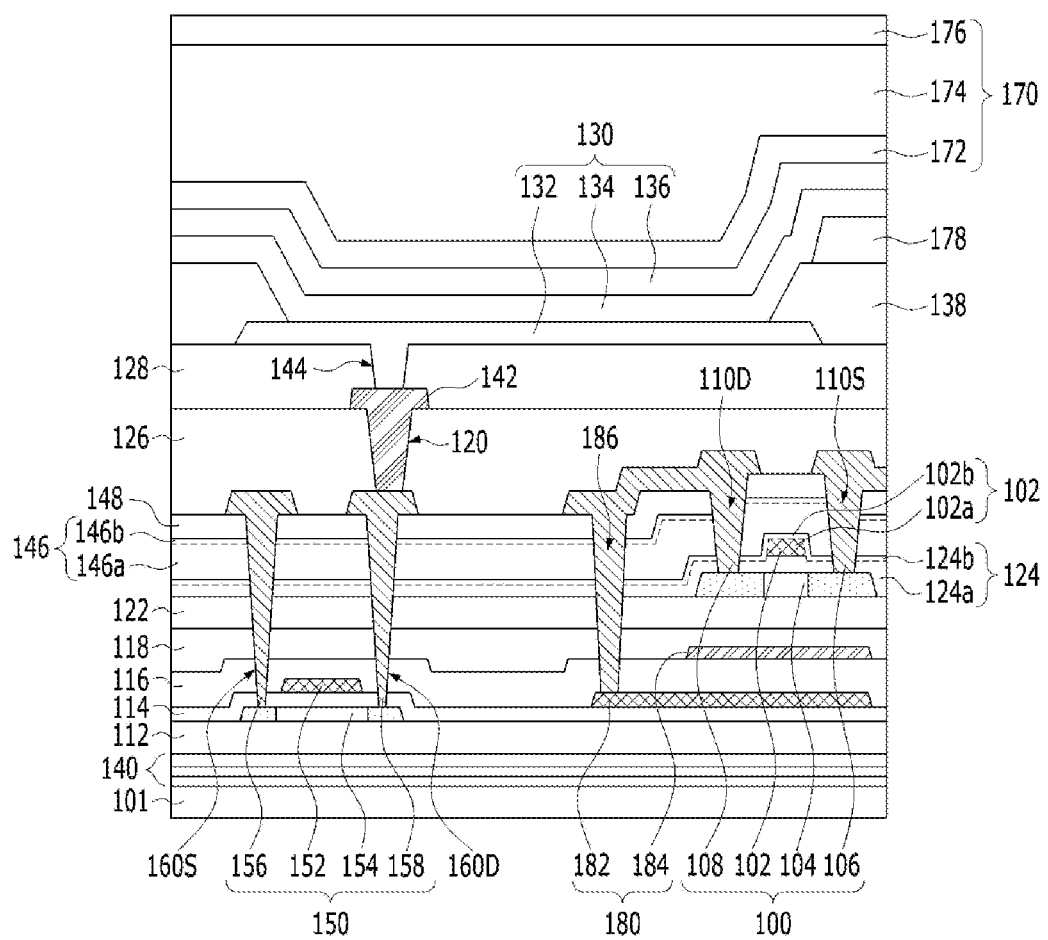

Referring to FIG. 7G, a pixel connection electrode 142, a light-emitting device 130, and an encapsulation unit 170 are sequentially formed on the substrate 101 having the source and drain electrodes 106, 108, 156, and 158 formed thereon.

In the present disclosure, as described above, hydrogen spread from the encapsulation unit 170 is trapped in the upper gate region 102b, the upper dielectric region 124b, and the upper interlayer region 146b by the trap element Te (e.g. nitrogen (N)) included in the upper gate region 102b, the upper dielectric region 124b, and the upper interlayer region 146b. As a result, it is possible to prevent hydrogen spread from the encapsulation unit 170 from being introduced into the oxide semiconductor layer 104. In the present disclosure, therefore, it is possible to prevent the channel region 104C of the oxide semiconductor layer 104 from becoming conductive due to hydrogen spread from the encapsulation unit 170, whereby it is possible to prevent fluctuation in threshold voltage of the switching transistor 100.

Figure 8:
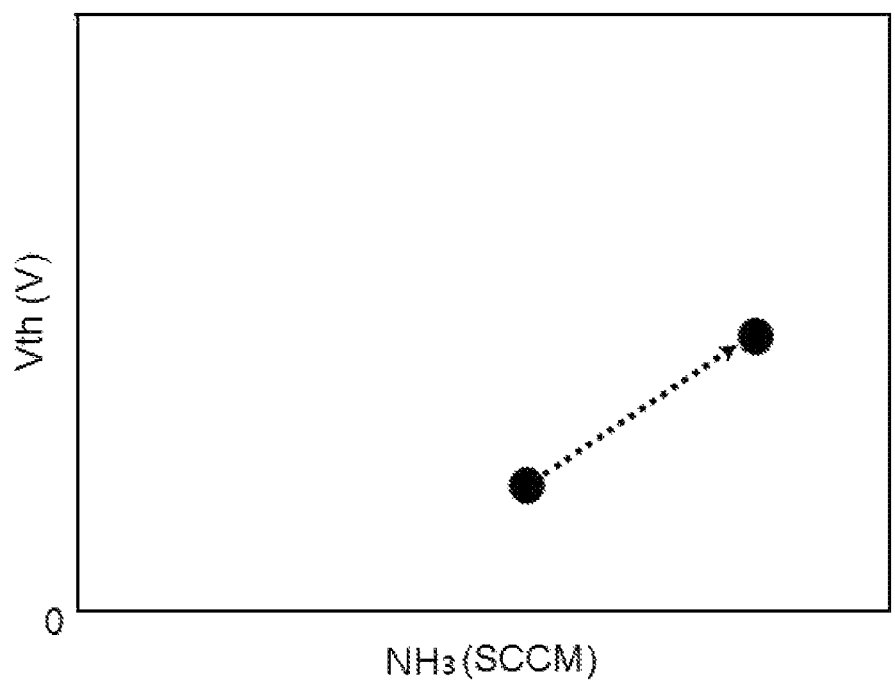
FIG. 8 is a view illustrating fluctuation in threshold voltage of a thin film transistor depending on the flow rate of a source gas including a trap element according to an embodiment of the present disclosure.

Specifically, as shown in FIG. 8, it can be seen that, when the flow rate of a source gas ($NH_3$) including a trap element (N) is increased under the condition in which the flow rate of silane gas ($SiH_4$) is uniform, threshold voltage Vth of a transistor moves in a positive (+) direction. That is, even though carrier concentration of the channel of the oxide semiconductor layer 104 is increased by hydrogen and thus threshold voltage Vth of the switching transistor 100 moves in a negative (−) direction, the threshold voltage Vth of the switching transistor 100 moves in the positive (+) direction through a plasma treatment process using a source gas ($NH_3$) including a trap element (N). In the present disclosure, therefore, it is possible to prevent fluctuation in threshold voltage of the switching transistor 100.

Also, in the present disclosure, the first gate electrode 102 may be formed so as to have a single-layered structure without a Ti conductive layer by a trap element Te included in one of the second interlayer dielectric film 146, the second gate dielectric film 124, and the first gate electrode 102. Consequently, the first gate electrode 102 according to the present disclosure has lower load resistance than a first gate electrode having a multilayered structure including a Ti conductive layer according to a comparative example, whereby it is possible to secure luminance uniformity in the active area AA and to reduce costs. For example, in the present disclosure, in the case in which the first gate electrode 102 is formed so as to have a single-layered structure formed of Mo, it is possible to remove a Ti layer, resistivity of which is eight times that of Mo, whereby it is possible to reduce resistance.

Furthermore, in the present disclosure, it is possible to prevent the occurrence of problems due to a difference in etching properties between a Mo layer and a Ti layer included in the first gate electrode according to the comparative example, such as a tail of the Ti layer, a high taper angle, and deviation in line width (CD) between the Mo layer and the Ti layer.

Meanwhile, although the structure in which the trap element Te is included in a portion of at least one of the first gate electrode 102, the second gate dielectric film 124, and the second interlayer dielectric film 146 disposed on the oxide semiconductor layer 104 has been described by way of example in the present disclosure, the trap element may be included in a portion of a thin film layer disposed under the oxide semiconductor layer 104. For example, the trap element Te may be included in a portion of at least one of the first and second upper buffer layers 118 and 122 and the upper storage capacitor electrode 184 disposed under the oxide semiconductor layer 104.

Also, in the present disclosure, the content of nitrogen (N) included in at least one of the third interlayer dielectric film 148 and the first upper buffer layer 118 formed of SiNx may be higher than that of the SiNx film included in the multi-buffer layer 140. In this case, nitrogen (N) included in the third interlayer dielectric film 148 and the first upper buffer layer 118 traps hydrogen spread to the oxide semiconductor layer 104, whereby it is possible to prevent fluctuation in threshold voltage of the switching transistor 100.

In addition, although the structure in which the trap element is included in at least one of the first gate electrode 102, the second gate dielectric film 124, and the second interlayer dielectric film 146 through the plasma treatment process has been described by way of example in the present disclosure, the trap element Te may be included in at least one of the first gate electrode 102, the second gate dielectric film 124, and the second interlayer dielectric film 146 through a doping process, a source gas including the trap element Te may be injected at the time of SiOx deposition of the second gate dielectric film 124, and the second interlayer dielectric film 146, or a source gas including the trap element Te may be injected at the time of Mo deposition of the first gate electrode 102.

Meanwhile, the present disclosure is applicable to an electronic device including a transistor, although the organic light-emitting display device has been described by way of example in the present disclosure.

As is apparent from the above description, a trap element is injected into a portion of a thin film layer having no nitrogen, among thin film layers disposed above or under an oxide semiconductor layer, whereby it is possible to prevent hydrogen from being spread to the oxide semiconductor layer. In the present disclosure, therefore, it is possible to prevent carrier concentration of a channel of a switching transistor from being increased by hydrogen. As a result, it is possible to prevent fluctuation in threshold voltage of the switching transistor, whereby it is possible to improve reliability of the switching transistor.

Also, in the present disclosure, a first gate electrode disposed on the oxide semiconductor layer is formed so as to have a single-layered structure, whereby it is possible to reduce load resistance of the gate electrode and to reduce processing costs and material costs.

Furthermore, in the present disclosure, it is possible to prevent the occurrence a tail, a high taper angle, and deviation in line width, which occurs in a first gate electrode having a multilayered structure.

It will be apparent to those skilled in the art that various modifications and variations can be made in the present invention without departing from the spirit or scope of the invention. Thus, it is intended that the present disclosure cover the modifications and variations of this disclosure provided they come within the scope of the appended claims and their equivalents.

What is claimed is:

1. A display device comprising:
   a thin film transistor disposed on a substrate, the thin film transistor comprising an oxide semiconductor layer and a gate electrode disposed on the oxide semiconductor layer;
   a light-emitting device electrically connected to the thin film transistor; and
   a plurality of dielectric films disposed between the oxide semiconductor layer and the light-emitting device,
   wherein at least one of the plurality of dielectric films is an interlayer dielectric film disposed on the gate electrode, wherein the interlayer dielectric film comprises:
   a lower region disposed on the gate electrode; and
   an upper region disposed on the lower region, the upper region comprising a trap element configured to prevent hydrogen from being spread to the oxide semiconductor layer, and wherein the upper region is above the gate electrode.

2. The display device according to claim 1, wherein the trap element comprises at least one of nitrogen, fluorine, and boron.

3. The display device according to claim 1, wherein the lower region has a lower content of the trap element than the upper region.

4. The display device according to claim 1, wherein a content of the trap element in the lower region is 0%.

5. The display device according to claim 1, wherein the trap element is formed such that a content of the trap element gradually decreases from an upper part of the upper region to a lower part of the upper region.

6. The display device according to claim 1, wherein the lower region is formed of SiOx.

7. The display device according to claim 1, wherein the thin film transistor comprises:
   a source electrode configured to contact the oxide semiconductor layer; and
   a drain electrode opposite the source electrode, the drain electrode being configured to contact the oxide semiconductor layer, and
   wherein the plurality of dielectric films comprises:
   the interlayer dielectric film disposed between the source electrode and the gate electrode, and between the drain electrode and the gate electrode; and
   a gate dielectric film disposed between the oxide semiconductor layer and the gate electrode.

8. The display device according to claim 7, wherein the interlayer dielectric film comprises:
   a lower interlayer region, which is the lower region; and
   an upper interlayer region, which is the upper region.

9. The display device according to claim 8, wherein the gate electrode comprises:
   an upper gate region comprising the trap element; and
   a lower gate region disposed between the oxide semiconductor layer and the upper gate region.

10. The display device according to claim 8, wherein the gate dielectric film comprises a lower dielectric region, and an upper dielectric region, and wherein the trap element included in the upper dielectric region of the gate dielectric film is disposed in a remaining region excluding a region configured to overlap the gate electrode.

11. The display device according to claim 8, wherein the gate dielectric film comprises a lower dielectric region, and an upper dielectric region, and wherein the trap element included in the upper dielectric region of the gate dielectric film is disposed in a remaining region excluding a region configured to overlap a channel region of the oxide semiconductor layer.

12. The display device according to claim 1, further comprising:
   a first upper buffer layer and a second upper buffer layer and a storage capacitor disposed under the oxide semiconductor layer,
   wherein at least one portion of at least one of the first upper buffer layer and the second upper buffer layer and an upper storage capacitor electrode of the storage capacitor includes the trap element.

13. The display device according to claim 12, wherein the upper storage capacitor electrode of the storage capacitor is electrically connected to a drain electrode of the thin film transistor.

14. The display device according to claim 1, further comprising:
   an encapsulation unit disposed on the light-emitting device, wherein the encapsulation unit includes a plurality of inorganic encapsulation layers and an organic encapsulation layer disposed between the plurality of inorganic encapsulation layers.

15. A method of manufacturing a display device comprising:
   forming an oxide semiconductor layer of a thin film transistor on a substrate;
   forming a gate dielectric film on the oxide semiconductor layer, and forming a gate electrode of the thin film transistor on the gate dielectric film;
   plasma-treating a surface of each of the gate electrode and the gate dielectric film using a source gas including a trap element to prevent hydrogen from being spread to the oxide semiconductor layer, such that at least one of the gate electrode and the gate dielectric film includes an upper region including the trap element and a lower region including no trap element;
   forming an interlayer dielectric film on the gate electrode and the gate dielectric film;
   plasma-treating a surface of the interlayer dielectric film using gas including the trap element to prevent hydrogen from being spread to the oxide semiconductor layer, such that the interlayer dielectric film includes an upper interlayer region including the trap element and a lower interlayer region including no trap element; and
   sequentially forming a source electrode and a drain electrode of the thin film transistor, a pixel connection electrode, a light-emitting device, and an encapsulation unit on the substrate.

16. A display device comprising:
   a thin film transistor disposed on a substrate, the thin film transistor comprising an oxide semiconductor layer;
   a light-emitting device electrically connected to the thin film transistor; and
   a plurality of dielectric films disposed between the oxide semiconductor layer and the light-emitting device,
   wherein the thin film transistor comprises:
      a gate electrode disposed on the oxide semiconductor layer;
      a source electrode configured to contact the oxide semiconductor layer; and
      a drain electrode opposite the source electrode, the drain electrode being configured to contact the oxide semiconductor layer, and
      a gate dielectric film disposed between the oxide semiconductor layer and the gate electrode,
   wherein the gate electrode comprises:
      an upper gate region comprising a trap element configured to prevent hydrogen from being spread to the oxide semiconductor layer; and
      a lower gate region disposed between the oxide semiconductor layer and the upper gate region,
   wherein at least one of the plurality of dielectric films is an interlayer dielectric film disposed on the gate electrode, wherein the interlayer dielectric film comprises:
      a lower region disposed on the gate electrode; and
      an upper region disposed on the lower region, the upper region comprising the trap element, wherein the upper region is above the gate electrode.

* * * * *